(12) United States Patent
Bader et al.

(10) Patent No.: US 11,378,531 B1
(45) Date of Patent: Jul. 5, 2022

(54) METHOD FOR FOCUSING AN ELECTRON BEAM ON A WAFER HAVING A TRANSPARENT SUBSTRATE

(71) Applicant: Applied Materials Israel Ltd., Rehovot (IL)

(72) Inventors: Arie Bader, Nes-Ziona (IL); Tamir Nuna, Ashdod (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 17/164,803

(22) Filed: Feb. 1, 2021

(51) Int. Cl.
  *H01J 37/28* (2006.01)
  *G01N 23/2251* (2018.01)

(52) U.S. Cl.
  CPC .......... *G01N 23/2251* (2013.01); *H01J 37/28* (2013.01); *G01N 2223/6116* (2013.01); *H01J 2237/049* (2013.01); *H01J 2237/24571* (2013.01)

(58) Field of Classification Search
  CPC .... G01N 23/2251; H01J 37/28; H01J 37/226; H01J 2237/049; H01J 2237/1501; H01J 2237/24571
  See application file for complete search history.

(56) References Cited

U.S. PATENT DOCUMENTS

| | | | |
|---|---|---|---|
| 5,585,629 A * | 12/1996 | Doran | G01B 15/00 250/310 |
| 6,670,610 B2 | 12/2003 | Shemesh et al. | |
| 8,709,269 B2 | 4/2014 | Shemesh | |
| 9,046,475 B2 | 6/2015 | Langer et al. | |
| 2003/0020891 A1 | 1/2003 | Tokita | |
| 2004/0179183 A1 | 9/2004 | Van Ballegoij et al. | |
| 2008/0078933 A1 | 4/2008 | Watanabe et al. | |
| 2009/0266802 A1* | 10/2009 | Sawabe | B23K 26/0853 219/121.78 |
| 2009/0309022 A1 | 12/2009 | Gunji et al. | |
| 2020/0133144 A1 | 4/2020 | Schmitt-Weaver et al. | |
| 2020/0215649 A1* | 7/2020 | Genda | H01L 21/6836 |

OTHER PUBLICATIONS

PCT/US2022/014669, "International Search Report and Written Opinion", dated May 13, 2022, 11 pages.

* cited by examiner

*Primary Examiner* — Eliza W Osenbaugh-Stewart
(74) *Attorney, Agent, or Firm* — Kilpatrick Townsend & Stockton LLP (57) ABSTRACT

A method, a non-transitory computer readable medium and a system for focusing an electron beam. The method may include focusing the electron beam on at least one evaluated area of a wafer, based on a height parameter of each one of the at least one evaluated area. The wafer includes a transparent substrate. The height parameter of each one of the at least one evaluated area is determined based on detection signals generated as a result of an illumination of one or more height-measured areas of the wafer with a beam of photons. The illumination occurs while one or more supported areas of the wafer contact one or more supporting elements of a chuck, and while each one of the one or more height-measured areas are spaced apart from the chuck by a distance that exceeds a depth of field of the optics related to the beam of photons.

17 Claims, 6 Drawing Sheets

METHOD FOR FOCUSING AN ELECTRON BEAM ON A WAFER HAVING A TRANSPARENT SUBSTRATE

BACKGROUND OF THE INVENTION

A scanning electron microscope is a high-resolution system for evaluating a sample such as a wafer, by scanning evaluated areas of the wafer with an electron beam. A review scanning electron microscope scans evaluated areas that include suspected defects. A metrology scanning electron microscope scans evaluated areas that include structural elements that should be measured.

When scanning an evaluated area, the electron beam should be focused onto the evaluated area. For example— the evaluated area should be within a focal plane of an objective lens of the scanning electron microscope.

The focusing is usually done based on a height map of the sample. The height map is generated using a height measurement unit that illuminates different areas of the wafer (referred to as height-measured areas) to provide height parameters of the height-measured areas. The height-measured areas usually cover only a small fraction of the wafer. The height parameters of areas that are not height-measured area are calculated by extrapolation or interpolation to provide the height map.

Some wafers have a transparent substrate that is supported by a chuck that contacts the entire transparent substrate.

A height parameter of a height-measured area is measured by illuminating the height-measured area with a beam of light, while the height-measured area is being supported by the chuck and contacted by the chuck.

In some cases, especially when the height-measured area is transparent—the beam of light may be reflected from the chuck—thereby introducing a height measurement error— as the height measurement may reflect the height of the chuck—and not the height of the height-measured area.

Such height measurement errors may cause the electron beam to be focused on the back of the wafer or to be focused on any other point that differs from the top of the wafer.

There is a growing need to provide an accurate solution for height parameter measurements.

BRIEF SUMMARY OF THE INVENTION

There may be provided a method, a non-transitory computer readable medium and a detection system for focusing an electron beam.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE INVENTION

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

The term "and/or" means additionally or alternatively.

An "evaluated area" is an area that should be evaluated. The evaluation may include defect review, metrology, and the like.

A "height-measured area" is an area having its height parameter measured.

The term "height parameter" of an area may be a parameter related to the entire area or to only a part (one or more points) of the area, may be related to an absolute height of the area, may be a parameter related to a relative height of the area, may be a height of the area, may be a distance from the area to a reference point (for example to an objective lens of an electron beam system), may be a height difference between the area and a reference point of the wafer, and the like. For simplicity of explanation, various examples listed below refer to a height parameter as being the height of the area.

The term "electron beam system" refers to a system that may generate one or more electron beams and scan or otherwise illuminate a sample (or an area of the sample) with the one or more electron beams. A scanning electron microscope is a non-limiting example of an electron beam system.

There is provided a method, a system, and a non-transitory computer readable medium that provide accurate height parameter measurements of height-measured areas of the wafer, while the height-measured areas are far enough from the chuck (even when supported area of the wafer are supported by the chuck). The distance between each height-measured areas and the chuck is large enough to prevent the chuck from affecting the height measurement of the height-measured area.

The accurate height parameter measurements may be processed (for example by generating a height map) to provide height parameters of areas of the wafer that differ from the height-measured areas, including a height parameter per each evaluated area.

A height parameter of an evaluated area is used to focus an electron beam on the evaluated area. For example, the height parameter may be used as a starting point for an auto-focus unit or for focusing the electron beam, and the like.

An evaluated area may also be a height-measured area. An evaluated area may differ from a height-measured area. An evaluated area may partially overlap a height-measured area. An evaluated area may not overlap a height-measured area.

The height parameter of an evaluated area may be determined based on a height parameter of one or more height-measured areas.

For example, if the evaluated area differs from the one or more height-measured areas then its height parameter may be used by applying a function (for example interpolation, extrapolation, weighted averaging, averaging, a machine learning function, a function that is not a machine learning function, or any other function) on the height parameters of the one or more height-measured areas.

A height of an evaluated area may be calculated by a processor or height measurement unit of the electron beam system based on the heights of the height-measured areas. A height of an evaluated area may be calculated by may be calculated by any other component or unit of the electron beam system, or may calculated by a computerized unit outside the electron beam system.

Figure 1:
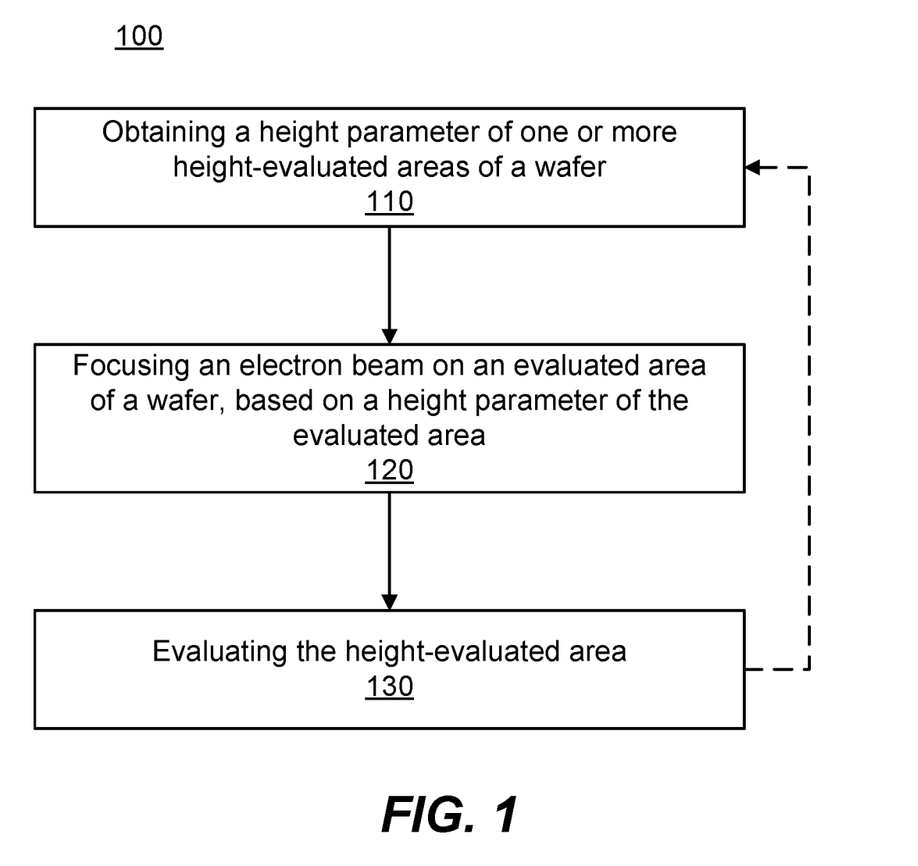
FIG. 1 illustrates an example of a method.

FIG. 1 illustrates method 100 for focusing an electron beam.

Method 100 may start by step 110 of obtaining a height parameter of one or more height-evaluated areas of the wafer.

Step 110 may include generating the height parameter of the one or more height-evaluated areas, or receiving the height parameter of the one or more height-evaluated areas.

The generating may include illuminating the one or more height-measured areas of the wafer with a beam of photons, generating (by one or more sensors) detection signals generated as a result of the illumination, and processing the detection signals to provide the height parameter of the one or more height-evaluated areas.

The illumination occurs while one or more supported areas of the wafer contact one or more supporting elements of a chuck, and while each one of the one or more height-measured areas is spaced apart from the chuck by a distance that is suffice to prevent any reflections from the chuck (if such exists) to affect the height parameter.

For example, each of the one or more height-measured areas may be spaced apart from the chuck by a distance that exceeds a depth of field of the optics related to the beam of photons. The optics may or may not belong to the height measurement unit.

The distance may exceed, for example, 1, 5, 10, 20, 30, 40, 50 millimeters, and the like.

The shape and size of a supported area of the wafer is defined by the shape and size of a corresponding supporting element of the chuck. For example, an annular supporting element may be located to support the edge of the wafer or any other annular shaped supported area of the wafer.

A supporting element of the chuck may be static or may be movable, for example may be lowered, lifted, or otherwise moved.

The one or more supported areas may be located anywhere in the wafer, the one or more supported areas may of be of any shape and/or size.

One supported area may be of the same shape and size as another supported area.

One supported area may be of a different shape and/or a different size as another supported area.

For example, the one or more supported areas of a wafer may be edge areas of the wafer or may differ from edge areas of the wafer.

The chuck may be configured to support wafers of one or more sizes.

A wafer of a first size may be supported by one or more supporting elements of the chuck while a wafer of another size may be supported by one or more other supporting elements of the chuck.

One or more supporting elements that support larger wafers may be higher than the one or more supporting smaller wafers. One or more supporting elements that support larger wafers may at least partially surround the smaller wafers.

Step 110 may be followed by step 120 of include focusing, by an electron beam system, the electron beam on at least one evaluated area of a wafer, based on (in response to) a height parameter of each one of the at least one evaluated area.

The height parameter of each one of the at least one evaluated area may be calculated, based on the height parameter of one or more height-evaluated areas of the wafer.

The calculation may be executed during step 110, during step 120, or during a dedicated step of calculating the height parameter of each one of the at least one evaluated area, based on the height parameter of one or more height-evaluated areas of the wafer.

When there are multiple evaluated areas, the calculation of the height parameter of all the multiple evaluated areas can be executed at once, per one evaluated area at a time, per a set of more than one evaluated areas at the time, and the like. For example, a height parameter of an evaluated area may be calculated after another evaluated area is evaluated, or before any other evaluated area is evaluated.

The calculation of the height parameters and/or the obtaining of the height parameter of one or more height-evaluated areas of the wafer may be performed, at least in part, during an alignment process of a wafer, or following the alignment process, and the like. The alignment process may include illuminating the one or more height-measured areas of the wafer, generating detection signals resulting from the illumination, and determining initial height parameters related to the wafer.

The focusing may be maintained during the scanning of the evaluated area or may be changed, for example by performing auto-focus.

Method 100 may include step 130 of evaluating the at least one evaluated area.

Step 130 may follow step 120, may be executed in parallel to step 120, or may executed in a partially overlapping manner with the execution of step 120.

Steps 110, 120 and 130 may be repeated for multiple wafers.

The chuck may support only wafers of the same size.

Alternatively, the chuck may support one or more wafers of different sizes. Wafers of different sizes may be supported by different supporting elements of the chuck or may share at least one supporting element of the chuck.

The chuck may be coated with a photon absorbing material. For example—the chuck may be coated with a black coating material.

Figure 2:
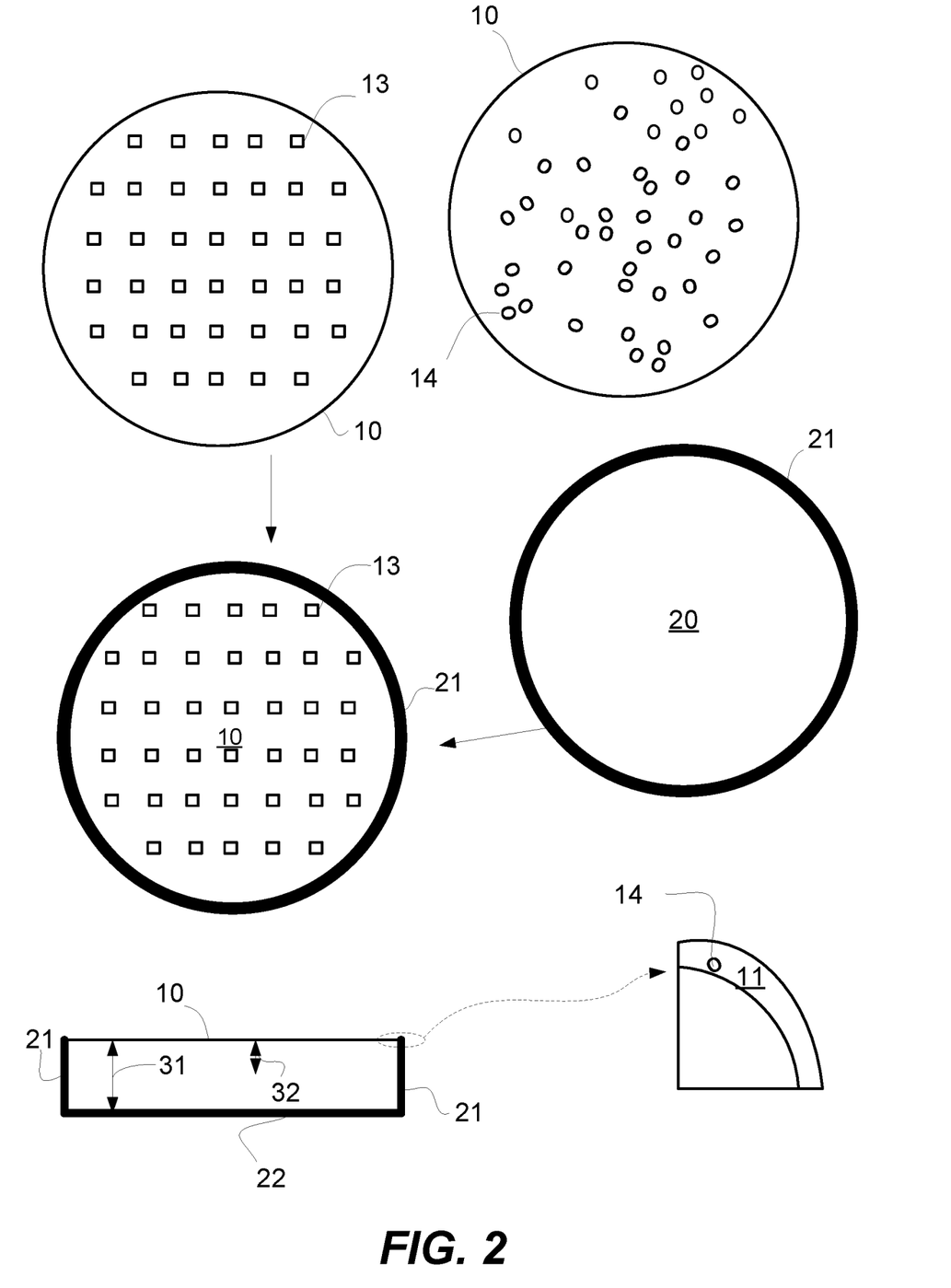
FIG. 2 illustrates an example of a wafer and a chuck.

FIG. 2 illustrates an example of a wafer 10, a supported area 11, height-measured areas 13, evaluated areas 14, a chuck 20, a supporting element 21 (that may be ring-shaped or have rounded sections) of the chuck, a distance 31 between the non-supported areas of the wafer and the bottom 22 of the chuck 20, and the focal depth 32 of optics (such as a height measurement unit) related to the beam of photons. Wafer 10 has a transparent substrate. The transparent substrate may be the entire wafer or the majority of wafer. For simplicity of explanation is it assumed that the entire element denoted 10 is a transparent substrate of the wafer.

Distance 31 exceeds the focal depth 32 so the when the height of a height-measured area 13 is measured, reflections from the chuck (especially—bottom 22 of chuck 20) do not impact the height parameter measurement.

FIG. 2 also illustrates that while the height-measured areas 13 are spaced apart from supported area 11, an evaluated area 14 can at least partially overlap the supported area 11.

Figure 3:
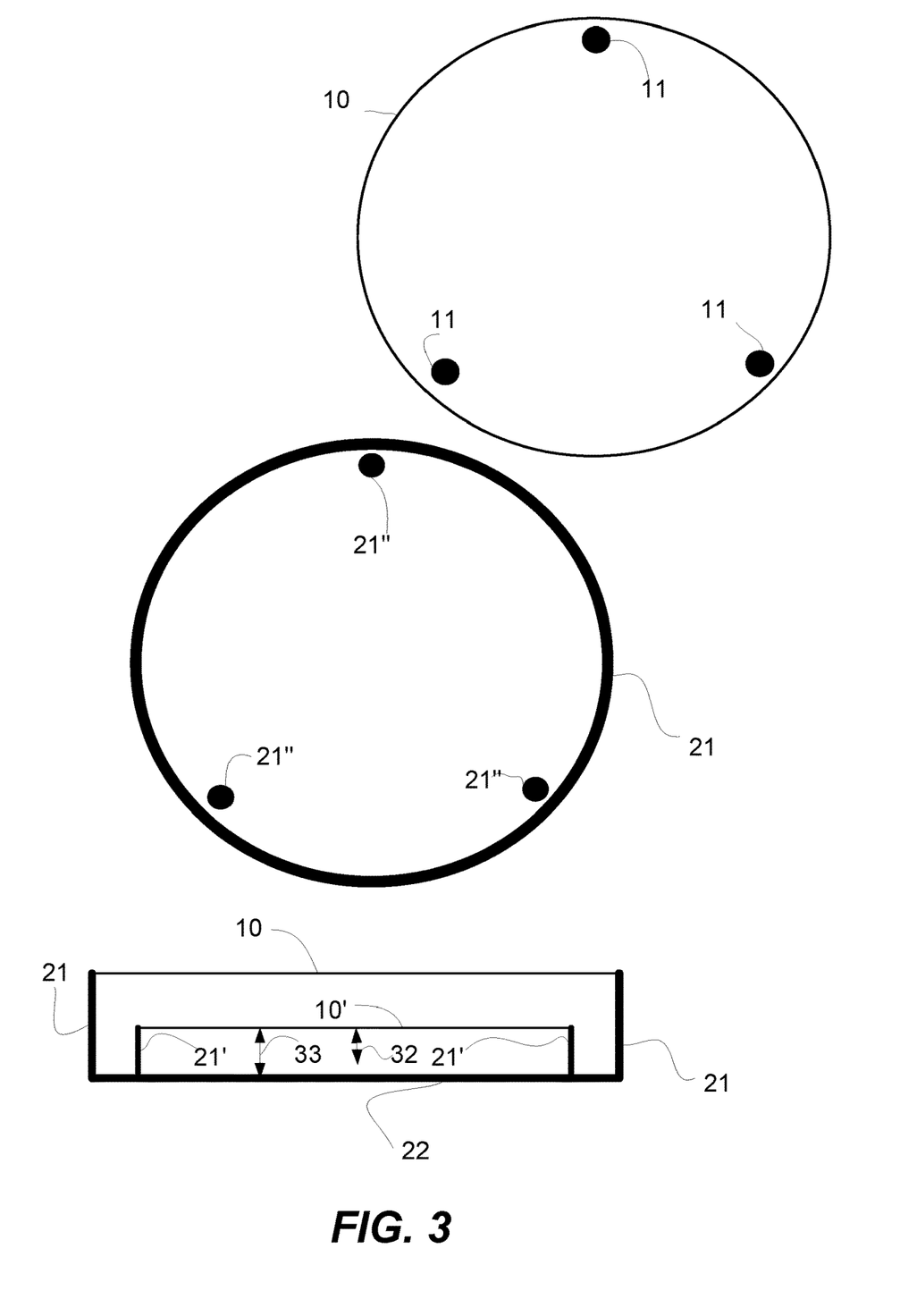
FIG. 3 illustrates an example of wafers and a chuck.

FIG. 3 is an example of wafer 10 supported by supporting element 21 of chuck 20, another wafer 10' (smaller than wafer 10), that is supported by other supporting elements 21' that has an annular shape. The distance 33 between the bottom to the other wafer 10' also exceeds the focal depth 32.

FIG. 3 also illustrates another example of three pins 21" that act as supporting elements of a wafer that is smaller than wafer 10.

Figure 4:
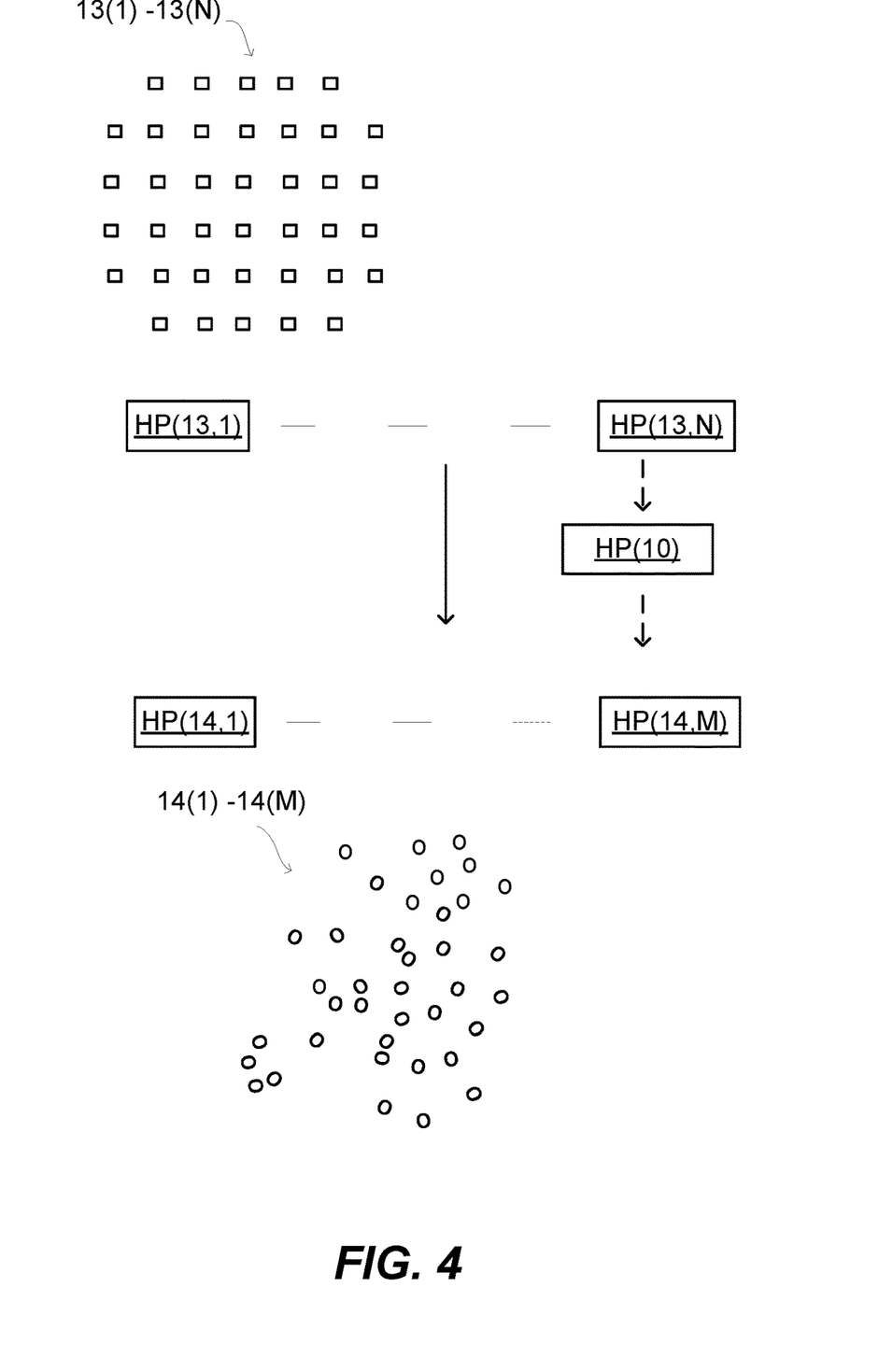
FIG. 4 illustrates an example of evaluated areas, height-measured areas, height parameters and a height map.

FIG. 4 is an example of a first plurality (N) height-measured areas 13(1)-13(N), of a second plurality (M) of evaluated areas 14(1)-14(M), height parameters HP(13,1)-HP(13,N) of the height-measured areas 13(1)-13(N), and height parameters HP(14,1)-HP(14,M) of the evaluated areas 14(1)-14(M).

The height parameters HP(13,1)-HP(13,N) of the height-measured areas 13(1)-13(N) may be processed, during step 110 of method 100, to provide the height parameters HP(14,1)-HP(14,M) of the evaluated areas 14(1)-14(M).

FIG. 4 also illustrates the generation of a wafer height parameter HP(10) of the entire wafer. It may reflect, for example, the average height of different areas of the wafer. The calculation of the wafer height parameter is optional.

Figure 5:
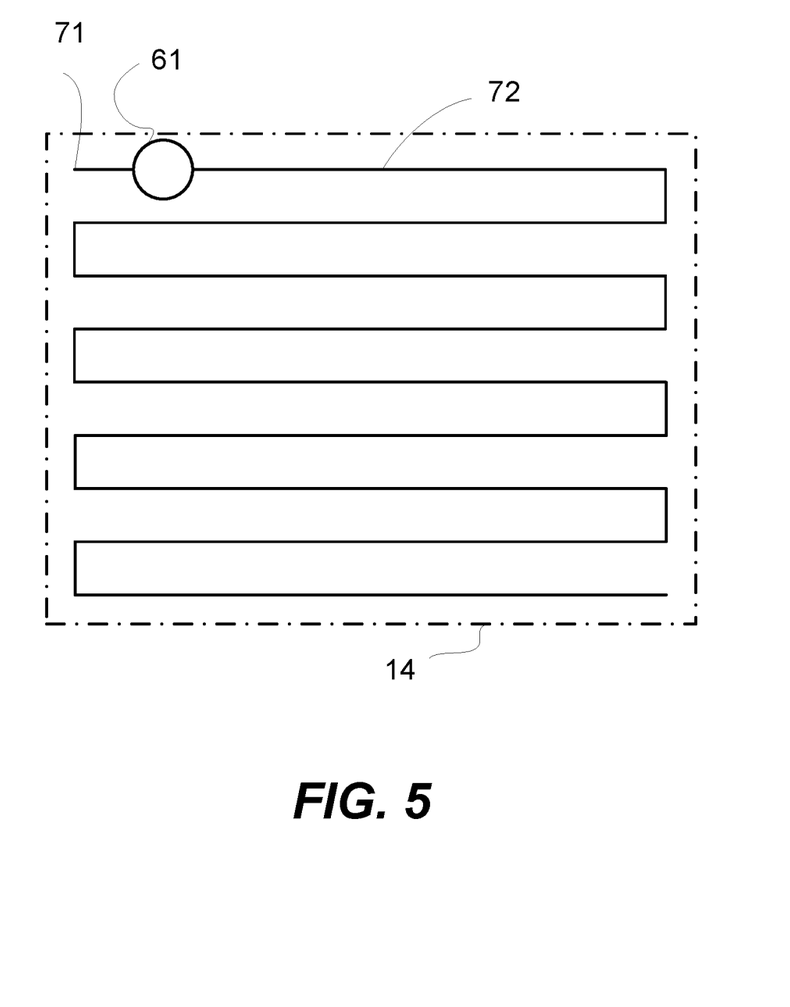
FIG. 5 illustrates an example of an evaluated area.

FIG. 5 illustrates an evaluated area 14, a scanning pattern 72 passed by electron beam 61 when scanning the evaluated area 14, and a start point 71 of the scanning pattern 72. A height parameter related to the evaluated area 14 may include, for example, the height of the start point 71, or the height of any other point of the evaluated area 14, or a function of heights of one or more points of the evaluated area.

Figure 6:
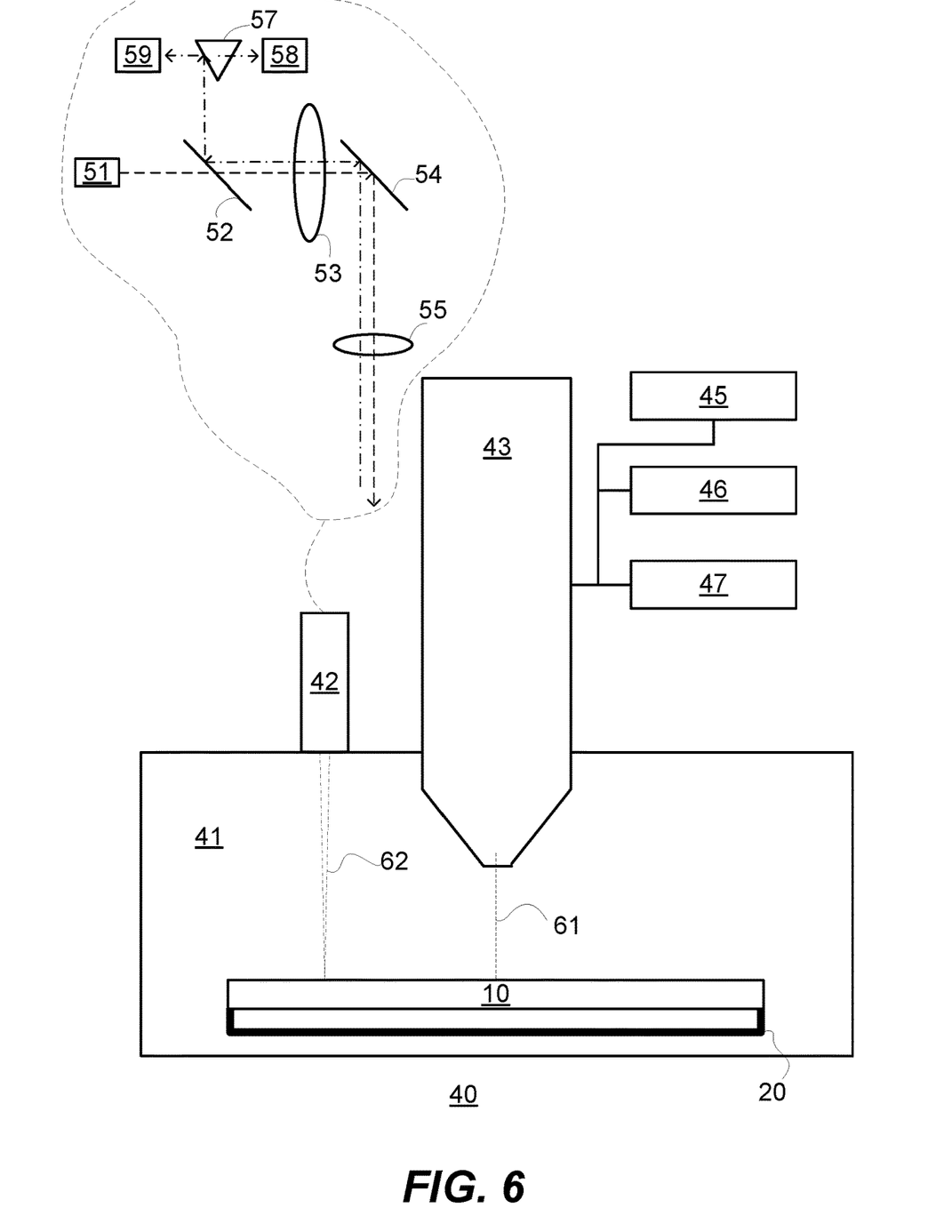
FIG. 6 illustrates an example of an electron beam system.

FIG. 6 illustrates an electron beam system 40 that includes a vacuum chamber 41, a chuck 20, an electron beam column 43, a height measurement unit 42, a processor 45, a memory unit 46, and a controller 47. Controller 47 is configured to control the electron beam system 40.

The wafer 10 is supported by chuck 20 and is located within the vacuum chamber 41.

The height measurement unit 42 may be configured to determine the height parameter of height-evaluated areas of the wafer by illuminating the height-evaluated areas with a beam of photons 62 (or with multiple beam of photons).

The electron beam column 43 may be configured to scan one or more evaluated area with electron beam 61 (or with multiple electron beams).

The electron beam system 40 may be configured to execute method 100.

FIG. 6 also provides an example of height measurement unit 42 that may be a laser focusing system.

The height measurement unit 42 may include a laser source 51, a two-way mirror 52, a first lens 53, a one-way mirror 54, a second lens 55, a prism 57, a first sensor 58 and a second sensor 59.

A light beam from laser source 51 passes through the two-way mirror 52, through the first lens 53, and impinges on the one-way mirror 54.

The one-way mirror 54 directs the light beam towards second lens 55. The second lens 55 focuses the light beam and directs the light beam towards the height-measured area.

The light beam is then reflected from the height-measured area towards the one-way mirror 54.

If the light beam is focused on the height-measured area, the reflected light beam propagates through the second lens 55, impinges on the center of the one-way mirror 54 and is directed towards the first lens 53. The reflected light beam passes through the first lens 53 and is reflected by the two-way mirror 52 towards a first location (for example center) of the prism 57. The prism 57 evenly divides the reflected light beam between the first sensor 58 and the second sensor 59.

If the light beam is not-focused on the height-measured area, the reflected light beam propagates through the second lens 55, impinges on an out-of-center location of the one-way mirror 54 and is directed towards the first lens 53. The reflected light beam passes through the first lens 53 and is reflected by the two-way mirror 52 towards a second location (for example out-of-center) of the prism 57. The prism 57 unevenly divides the reflected light beam between the first sensor 58 and the second sensor 59.

Accordingly, the relationship between the light detected by the first sensor 58 and the second sensor 59 indicates whether the light beam is focused or not, and is unfocused, provides an indication about the amount of un-focus.

Other height measurement units may be provided.

It should be noted that method 100 may be executed by a system that does not include the electron beam optics.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. A method for focusing an electron beam, the method comprising:
    focusing, by an electron beam system, the electron beam on at least one evaluated area of a wafer, based on a height parameter of each one of the at least one evaluated area;
    wherein the wafer comprises a transparent substrate;
    wherein the height parameter of each one of the at least one evaluated area is determined based on detection signals generated as a result of an illumination of one or more height-measured areas of the wafer with a beam of photons; and
    wherein the illumination occurs while one or more supported areas of the wafer contact one or more supporting elements of a chuck, and while each one of the one or more height-measured areas are spaced apart from the chuck by a distance that exceeds a depth of field of optics related to the beam of photons.

2. The method according to claim 1 wherein the distance exceeds ten millimeters.

3. The method according to claim 1 wherein the one or more supported areas of the wafer are edge areas of the wafer.

4. The method according to claim 3 wherein the one or more supported areas of the wafer are contacted by an annular area of the chuck.

5. The method according to claim 1 wherein the focusing of the electron beam on the at least one evaluated area of the wafer is preceded by an alignment process, the alignment process comprises illuminating the one or more height-measured areas of the wafer, generating the detection signals, and determining initial height parameters related to the wafer.

6. The method according to claim 1 wherein the focusing of the electron beam on an evaluated area of the at least one evaluated area of the wafer, is followed by scanning the evaluated area with the electron beam.

7. The method according to claim 6 wherein the at least one evaluated area comprises a first evaluated area, a second evaluated area, and a third evaluated area, and wherein the method further comprises determining a height parameter of the second evaluated area after scanning the first evaluated area with the electron beam, and before scanning the third evaluated area with the electron beam.

8. The method according to claim 1 wherein an evaluated area of the at least one evaluated area, at least partially overlaps a height-measured area of the one or more height-measured areas.

9. The method according to claim 1 wherein an evaluated area of the at least one evaluated area is spaced apart from each one of the one or more height-measured areas.

10. The method according to claim 1 wherein the wafer is a first wafer and wherein the method further comprises:
focusing the electron beam on at least one other evaluated area of a second wafer, based on a height parameter of each one of the at least one other evaluated area;
wherein the second wafer differs by size than the first wafer;
wherein the second wafer comprises a transparent substrate;
wherein the height parameter of each one of the at least one other evaluated area is determined based on detection signals generated as a result of an illumination of one or more other height-measured areas of the second wafer with the beam of photons;
wherein the illumination occurs while one or more other supported areas of the second wafer contact one or more other areas of the chuck, while each one of the one or more other height-measured areas are spaced apart from the chuck by a distance that exceeds the depth of field of the optics related to the beam of photons; and
wherein the one or more other areas of the chuck are spaced apart from the one or more supporting elements of the chuck.

11. The method according to claim 10 wherein the one or more other areas of the chuck are surrounded by the one or more supporting elements of the chuck.

12. The method according to claim 1 wherein the chuck is coated with a photon absorbing material.

13. An electron beam system, comprising:
a height measurement unit;
a chuck that comprises one or more supporting elements that are configured to support one or more supported areas of a wafer while each one of the one or more height-measured areas of the wafer are spaced apart from the chuck by a distance that exceeds a depth of field of optics of the height measurement unit;
wherein the wafer comprises a transparent substrate;
wherein the height measurement unit is configured to measure heights of the one or more height-measured areas by illuminating the one or more height-measured areas with a beam of photons, while the wafer is supported by the chuck; and
an electron beam column that is configured to focus an electron beam on at least one evaluated area of the wafer, based on a height parameter of each one of the at least one evaluated area; and
wherein the electron beam system is configured to determine the height parameter of each one of the at least one evaluated area based on the heights of the one or more height-measured areas.

14. The electron beam system according to claim 13 wherein the distance exceeds ten millimeters.

15. A method for scanning areas of a wafer, the method comprising:
measuring a height of each area of the areas by illuminating the area with a photon beam, wherein the measuring occurs while the wafer is supported by a chuck and the area is spaced apart from the chuck by at least ten millimeters; and
evaluating each area of the areas by scanning the area with an electron beam that is focused on the area, wherein a focusing of the electron beam is responsive to the height of the area.

16. The method according to claim 15 wherein the measuring of the height of each area is executed during an alignment process that precedes the evaluating of the area.

17. The method according to claim 15 wherein the measuring of the height of one of the areas occurs after an evaluating of at least one other area of the areas.

* * * * *